United States Patent
Watanabe et al.

(10) Patent No.: US 12,125,883 B2
(45) Date of Patent: Oct. 22, 2024

(54) BIAXIALLY ORIENTED SiC COMPOSITE SUBSTRATE AND SEMICONDUCTOR DEVICE COMPOSITE SUBSTRATE

(71) Applicant: NGK Insulators, Ltd., Nagoya (JP)

(72) Inventors: Morimichi Watanabe, Nagoya (JP); Kiyoshi Matsushima, Nagoya (JP); Jun Yoshikawa, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 228 days.

(21) Appl. No.: 17/663,229

(22) Filed: May 13, 2022

(65) Prior Publication Data
US 2022/0278206 A1    Sep. 1, 2022

Related U.S. Application Data

(63) Continuation of application No. PCT/JP2021/001148, filed on Jan. 15, 2021.

(30) Foreign Application Priority Data

Jan. 24, 2020   (JP) ................................. 2020-009649

(51) Int. Cl.
*H01L 29/00*      (2006.01)
*H01L 21/02*      (2006.01)
(Continued)

(52) U.S. Cl.
CPC .... *H01L 29/1608* (2013.01); *H01L 21/02378* (2013.01); *H01L 21/02433* (2013.01);
(Continued)

(58) Field of Classification Search
CPC ... H01L 29/04; H01L 29/045; H01L 29/1608; H01L 21/02378; H01L 21/02529
See application file for complete search history.

(56) References Cited

U.S. PATENT DOCUMENTS 6,053,973 A       4/2000  Tanino et al.
2002/0167010 A1  11/2002 Mueller
(Continued)

FOREIGN PATENT DOCUMENTS

JP    H11-147794 A    6/1999
JP    H11-268995 A   10/1999
(Continued)

OTHER PUBLICATIONS

International Search Report and Written Opinion (Application No. PCT/JP2021/001148) dated Mar. 9, 2021 (with English translation).
(Continued)

*Primary Examiner* — Reema Patel
(74) *Attorney, Agent, or Firm* — BURR PATENT LAW, PLLC

(57) ABSTRACT

A biaxially oriented SiC composite substrate includes a first biaxially oriented SiC layer that contains a threading screw dislocation and a basal plane dislocation, and a second biaxially oriented SiC layer that is formed continuously from the first biaxially oriented SiC layer and that contains $1\times10^{16}$ atoms/cm$^3$ or more and $1\times10^{19}$ atoms/cm$^3$ or less of a rare earth element. The defect density of a surface of the second biaxially oriented SiC layer is smaller than the defect density of the first biaxially oriented SiC layer.

11 Claims, 3 Drawing Sheets

(51) Int. Cl.
*H01L 29/04* (2006.01)
*H01L 29/16* (2006.01)

(52) U.S. Cl.
CPC .. *H01L 21/02529* (2013.01); *H01L 21/02581* (2013.01); *H01L 21/02609* (2013.01); *H01L 21/0262* (2013.01); *H01L 21/02628* (2013.01); *H01L 29/04* (2013.01); *H01L 21/02667* (2013.01)

(56) References Cited

U.S. PATENT DOCUMENTS

| | | |
|---|---|---|
| 2009/0178610 A1 | 7/2009 | Sakamoto et al. |
| 2014/0284619 A1 | 9/2014 | Nishio et al. |
| 2015/0167197 A1 | 6/2015 | Ujihara et al. |
| 2021/0102311 A1 | 4/2021 | Tokuda et al. |

FOREIGN PATENT DOCUMENTS

| | | | |
|---|---|---|---|
| JP | 2004-533720 A | | 11/2004 |
| JP | 2004323293 A | * | 11/2004 |
| JP | 2005-239465 A | | 9/2005 |
| JP | 2007-277049 A | | 10/2007 |
| JP | 2012-046384 A | | 3/2012 |
| JP | 2014-031316 A | | 2/2014 |
| JP | 2014-043369 A | | 3/2014 |
| JP | 2014-185048 A | | 10/2014 |
| JP | 6197722 B2 | | 9/2017 |
| JP | 2019-218229 A | | 12/2019 |
| WO | 2014/189008 A1 | | 11/2014 |

OTHER PUBLICATIONS

English translation of the International Preliminary Report on Patentability (Chapter I) dated Aug. 4, 2022 (Application No. PCT/JP2021/001148).

* cited by examiner

BIAXIALLY ORIENTED SiC COMPOSITE SUBSTRATE AND SEMICONDUCTOR DEVICE COMPOSITE SUBSTRATE

BACKGROUND OF THE INVENTION

1. Field of the Invention

The present invention relates to a biaxially oriented SiC composite substrate and semiconductor device composite substrate.

2. Description of the Related Art

SiC (silicon carbide) is attracting much attention as a wide bandgap material with which high voltage and high current can be controlled with low loss. Representative examples of dislocations present in SiC single crystals include basal plane dislocations, threading screw dislocations, and threading edge dislocations, and it is said that the total dislocation density of currently commercially available SiC single crystal substrates is as high as about $10^3$ to $10^4$ cm$^{-2}$ (for example, PTL 1). Thus, unlike Si for which dislocation-free crystals have been industrially achieved, SiC is a single crystal material with which devices must be produced from regions having certain dislocation densities. Moreover, these dislocations are known to have different effects on the device performance. There have been proposed SiC single crystals produced by a solution method and having fewer threading screw dislocations. For example, PTL 2 discloses a SiC single crystal substrate manufactured by a technique of forming macro-steps on seed crystals during film forming, and describes that because SiC single crystal macro-steps having a large height are formed on crystal growth surfaces of the seed crystals, SiC single crystals with fewer threading screw dislocations are obtained as the macro-steps subsequently evolve and crystals grow. According to the technique disclosed in PTL 2, the threading screw dislocations are converted into stacking faults and discharged to outside the crystals as the macro-steps evolve, and, thus, characteristically, stacking faults propagate in the direction in which the macro-steps evolve. In addition, PTL 3 discloses that addition of particular amounts of Nb, Ta, Mo, W, and Ir to SiC single crystals inhibits emergence of dislocations caused by thermal stress that occurs during growth of SiC single crystals, and inhibits emergence dislocations even when a SiC layer is formed on SiC single crystals by epitaxial growth.

CITATION LIST

Patent Literature

PTL 1: JP 6197722 B
PTL 2: JP 2014-043369 A
PTL 3: JP 2019-218229 A

SUMMARY OF THE INVENTION

However, the issue with the SiC single crystals manufactured by the technique disclosed in PTL 2 is that extensive warping occurs. Although the cause for this is not clear, it is believed that aligning of stacking faults in one direction (macro-step evolving direction) generates some type of stress distribution inside the substrate, and this has caused warping. Moreover, in PTL 2, the focus is on reducing threading screw dislocations by converting the threading screw dislocations into stacking faults, and thus no specific studies have been made on reducing basal plane dislocations. When there are many threading screw dislocations, the long-term reliability of an insulating film is degraded, and leakage breaking tends to occur, resulting in a short device lifetime. When there are many basal plane dislocations, the on-resistance tends to increase and so does the power loss during device operation; thus, the energy-saving performance of the device is degraded. Accordingly, both threading screw dislocations and basal plane dislocations are preferably reduced. Moreover, in PTL 3, Nb, Ta, and the like could not be added to SiC single crystals if Nb, Ta, and the like have adverse effects on properties of the semiconductor.

The present invention has been made to address such issues, and a main object thereof is to provide a biaxially oriented SiC composite substrate in which the density of defects reaching the surface is low and warping is small.

A biaxially oriented SiC composite substrate of the present invention includes: a first biaxially oriented SiC layer that contains a threading screw dislocation and a basal plane dislocation; and a second biaxially oriented SiC layer that is formed continuously from one surface of the first biaxially oriented SIC layer and that contains $1 \times 10^{16}$ atoms/cm$^3$ or more and $1 \times 10^{19}$ atoms/cm$^3$ or less of a rare earth element, wherein: a defect density of a surface of the second biaxially oriented SiC layer is smaller than a defect density of the first biaxially oriented SiC layer.

In this biaxially oriented SiC composite substrate, the second biaxially oriented SiC layer has a rare earth element concentration set within the range of $1 \times 10^{16}$ atoms/cm$^3$ or more and $1 \times 10^{19}$ atoms/cm$^3$ or less. Thus, the density of defects that reach the surface of the second biaxially oriented SiC layer can be decreased compared to the first biaxially oriented SiC layer. Such a biaxially oriented SiC composite substrate has less warpage and a low density of defects that reach the surface of the second biaxially oriented SiC layer; thus, this biaxially oriented SiC composite substrate is suitable for producing a semiconductor device by forming a functional layer on the surface by epitaxial growth or the like. Moreover, since the second biaxially oriented SiC layer does not contain Nb, Ta, etc., the composite substrate can be used even in a situation where components such as Nb and Ta affect semiconductor properties.

Here, a biaxially oriented SiC layer refers to a SiC layer oriented along two axes, i.e., the a-axis and the c-axis. The defect density refers to a total of the density of threading screw dislocations (TSDs) and the density of basal plane dislocations (BPDs).

The reason why the density of defects that reach the surface of the second biaxially oriented SiC layer is small is not clear, but the mechanism is presumably as follows.

A first conceivable cause for defect formation is propagation of defects that are present in the underlying layer. That is, when a second biaxially oriented SiC layer is formed on a first biaxially oriented SiC layer, defects that are present in the first biaxially oriented SiC layer can propagate into the second biaxially oriented SiC layer. Inclusion of a particular amount of a rare earth element in the second biaxially oriented SiC layer may have an effect of suppressing propagation of defects. The mechanism thereof is also not exactly clear, but, presumably, the rare earth element, Al, and N gather around the defects that have propagated into the biaxially oriented SiC layer and thereby suppress formation of a biaxially oriented SiC layer around these defects, and thus a biaxially oriented SiC layer preferentially grows from defect-free healthy regions, as a result of which defects reaching the surface of the second biaxially oriented SiC layer are reduced. In addition, it is also conceivable that defects that have propagated into the second biaxially oriented SiC layer are likely to undergo pair-annihilation at the early stage due to inclusion of particular amounts of the rare earth element, Al, and N at particular ratios.

A second conceivable cause for defect formation is the lattice mismatch. A lattice mismatch may occur when the impurity content is different between the first biaxially oriented SiC layer and the second biaxially oriented SiC layer. Here, it is considered that inclusion of particular amounts of the rare earth element, Al, and N at particular ratios in the second biaxially oriented SiC layer can alleviate the stress caused by lattice mismatch in the film and decrease the defect density. It is also possible that pair-annihilation readily occurs among these defects. Moreover, a second biaxially oriented SiC layer that has desired properties (for example electrical characteristics) can be obtained, while moderating the stress caused by lattice mismatch, when the second biaxially oriented SiC layer contains particular amounts of the rare earth element, Al, and N at particular ratios.

A third conceivable cause for defect formation is the thermal stress caused by the temperature distribution that emerges during formation of the second biaxially oriented SiC layer or during post-formation cooling to room temperature. Here, it is considered that inclusion of particular amounts of the rare earth element, Al, and N at particular ratios in the second biaxially oriented SiC layer alleviates the thermal stress and suppresses emergence of new defects.

In the biaxially oriented SiC composite substrate of the present invention, the rare earth element contained in the second biaxially oriented SiC layer includes at least one element selected from the group consisting of 17 elements, that is, Sc, Y, La, Ce, Pr, Nd, Pm, Sm, Eu, Gd, Tb, Dy, Ho, Er, Tm, Yb, and Lu. The rare earth element is preferably at least one selected from the group consisting of Y, Sm, Ho, Dy, and Yb. In this manner, the density of defects that reach the surface of the second biaxially oriented SiC layer can be further decreased.

In the biaxially oriented SiC composite substrate of the present invention, the density of the defects that reach the surface of the second biaxially oriented SiC layer is not particularly limited, but is preferably $1.0 \times 10^2/cm^2$ or less, more preferably $1.0 \times 10^1/cm^2$ or less, and yet more preferably $1.0 \times 10^0/cm^2$ or less.

In the biaxially oriented SiC composite substrate of the present invention, the second biaxially oriented SiC layer preferably contains Al, and the Al concentration in the second biaxially oriented SiC layer is preferably $1 \times 10^{16}$ atoms/cm$^3$ or more and $1 \times 10^{21}$ atoms/cm$^3$ or less. In this manner, the density of defects that reach the surface of the second biaxially oriented SiC layer can be further decreased. The (Al concentration)/(rare earth element concentration) in the second biaxially oriented SiC layer is preferably $1 \times 10^{-2}$ or more and $1 \times 10^5$ or less.

In the biaxially oriented SiC composite substrate of the present invention, the second biaxially oriented SiC layer preferably contains N in addition to Al, and the N concentration in the second biaxially oriented SiC layer is preferably $1 \times 10^{17}$ atoms/cm$^3$ or more and $1 \times 10^{22}$ atoms/cm$^3$ or less. In this manner, the density of defects that reach the surface of the second biaxially oriented SiC layer can be further decreased. The (N concentration)/(rare earth element concentration) in the second biaxially oriented SiC layer is preferably $1 \times 10^{-2}$ or more and $1 \times 10^5$ or less.

In the biaxially oriented SiC composite substrate of the present invention, the (N concentration)/(Al concentration) in the second biaxially oriented SiC layer is preferably 3 or more and 5 or less, the concentrations of the rare earth element, Al, and N in the second biaxially oriented SiC layer are preferably in the relationship, N>Al> rare earth element, and the concentrations of the rare earth element, Al, and N in the second biaxially oriented SiC layer are preferably higher than those in the first biaxially oriented SiC layer.

In the biaxially oriented SiC composite substrate of the present invention, from the viewpoint of decreasing the density of defects reaching the surface of the second biaxially oriented SiC layer, Ar is preferably contained near the interface between the first biaxially oriented SiC layer and the second biaxially oriented SiC layer, and the defect density of the first biaxially oriented SiC layer is preferably low.

A semiconductor device composite substrate of the present invention includes any of the biaxially oriented SiC composite substrates described above, and a semiconductor device functional layer disposed on the second biaxially oriented SiC layer of the biaxially oriented SiC composite substrate.

Examples of such a semiconductor device composite substrate include a MOSFET, an IGBT, an LED, and a HEMT.

DETAILED DESCRIPTION OF THE INVENTION

Figure 1:
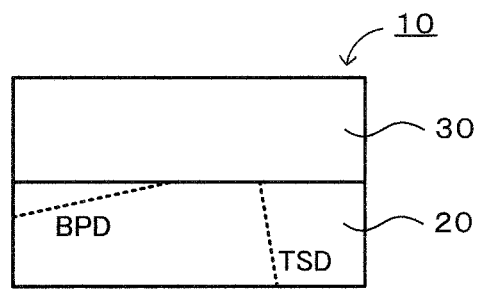
FIG. 1 is a schematic diagram of a biaxially oriented SiC composite substrate 10.

Preferable embodiments of the present invention will now be described with reference to the drawings. FIG. 1 is a schematic diagram of a biaxially oriented SiC composite substrate 10 according to an embodiment.

As illustrated in FIG. 1, the biaxially oriented SiC composite substrate 10 includes a first biaxially oriented SiC layer 20 and a second biaxially oriented SiC layer 30. Here, a biaxially oriented SiC layer refers to a layer oriented along both the a-axis and the c-axis. The first biaxially oriented SiC layer 20 includes a threading screw dislocation (TSD) and a basal plane dislocation (BPD). The second biaxially oriented SiC layer 30 is formed continuously on one of the surfaces of the first biaxially oriented SiC layer 20, and contains $1 \times 10^{16}$ atoms/cm$^3$ or more and $1 \times 10^{19}$ atoms/cm$^3$ or less of a rare earth element. The defect density of the second biaxially oriented SiC layer is smaller than the defect density of the first biaxially oriented SiC layer 20. When such a two-layer structure is employed, a biaxially oriented SiC composite substrate in which there are few threading screw dislocations and basal plane dislocations reaching the substrate surface and warping is small can be provided. Here, the substrate surface refers to a surface of the second biaxially oriented SiC layer 30, the surface being opposite from the surface in contact with the first biaxially oriented SiC layer 20. The rare earth element includes at least one element selected from the group consisting of 17 elements, Sc, Y, La, Ce, Pr, Nd, Pm, Sm, Eu, Gd, Tb, Dy, Ho, Er, Tm, Yb, and Lu. The rare earth element is preferably at least one selected from the group consisting of Y, Sm, Ho, Dy, and Yb.

The first biaxially oriented SiC layer 20 has a crystal growth surface. The first biaxially oriented SiC layer 20 is preferably a layer composed of SiC single crystals. Although the polytype, the off-angle, and the polarity of the SiC single crystals are not particularly limited, the polytype is preferably 4H or 6H, the off-angle is preferably 0.1 to 12° with respect to the [0001] axis of the SiC single crystals, and the surface on which the second biaxially oriented SiC layer 30 is formed is preferably a Si-face. More preferably, the polytype is 4H, the off-angle is 1 to 5° with respect to the [0001] axis of the SiC single crystals, and the surface on which the second biaxially oriented SiC layer 30 is formed is a Si-face.

The second biaxially oriented SiC layer 30 is formed on the crystal growth surface of the first biaxially oriented SiC layer 20. The second biaxially oriented SiC layer 30 is a SiC layer oriented along two axes, the a-axis and the c-axis. This biaxially oriented SiC layer may be a SiC single crystal, a SIC polycrystal, or a mosaic crystal as long as the layer is oriented along two axes, the c-axis and the a-axis. A mosaic crystal refers to a bunch of crystals that are slightly misoriented along one or both of the c-axis and the a-axis although there are no clear grain boundaries. The orientation evaluation method is not particularly limited, and, for example, a known analysis technique such as an EBSD (electron backscatter diffraction patterns) method or an X-ray pole figure can be employed. For example, when an EBSD method is used, an inverse pole figure map is obtained from a surface (plate surface) of a biaxially oriented SiC layer or a cross section orthogonal to the plate surface. A layer is defined to be biaxially oriented in a near normal direction and in a near plate-surface direction when the following four conditions are met in the obtained inverse pole figure map: (A) the layer is oriented in a particular direction (first axis) nearly normal to the plate surface; (B) the layer is oriented in a particular direction (second axis) nearly within the plate surface and orthogonal to the first axis; (C) the tilt angle with respect to the first axis is distributed within ±10°; and (D) the tilt angle with respect to the second axis is distributed within ±10°. In other words, when the aforementioned four conditions are satisfied, the layer is determined to be oriented biaxially, that is, along the c-axis and the a-axis. For example, when the direction nearly normal to the plate surface is oriented along the c-axis, the near in-plane direction is to be oriented in a particular direction (for example, along a-axis) orthogonal to the c-axis. A biaxially oriented SiC layer is to be oriented along two axes in the near normal direction and in the near in-plane direction; however, preferably, the near normal direction is oriented along the c-axis. The smaller the tilt angle distribution in the near normal direction and/or the near in-plane direction, the smaller the mosaicity of the biaxially oriented SiC layer, and the layer approaches single crystal as the tilt angle distribution approaches zero. Thus, from the viewpoint of the crystallinity of the biaxially oriented SiC layer, the tilt angle distribution is preferably small both in the near normal direction and the near plate-surface direction, and, for example, is preferably ±5° or less and more preferably ±3° or less.

The second biaxially oriented SiC layer 30 has a defect density of typically $1.0 \times 10^2/cm^2$ or less, preferably $1.0 \times 10^1/cm^2$ or less, and more preferably $1.0 \times 10^0/cm^2$ or less, when the defect density is defined as a number of basal plane dislocations and threading screw dislocations reaching the surface thereof per unit area. The lower limit of the defect density is not particularly limited, but is typically $1.0 \times 10^{-3}/cm^2$ or more and more typically $1.0 \times 10^{-2}/cm^2$ or more. In the defect density evaluation method, known etch-pit evaluation by molten KOH etching is employed. When the etch pit evaluation by molten KOH etching is impossible, PL mapping, X-ray topography, CL mapping, or the like may be performed. The defect density can also be evaluated by such a technique.

As mentioned above, the density of crystal defects propagating to the surface of the second biaxially oriented SiC layer 30 can be extensively decreased. Furthermore, the biaxially oriented SiC composite substrate 10 of this embodiment has a low crystal defect density and less warpage.

The reason for this is not clear but is probably that the in-plane distribution of the crystal defects is small or even zero inside the second biaxially oriented SiC layer 30 and that the stress is evenly distributed within the plane of the substrate.

From the viewpoint of imparting electrical conductivity to the biaxially oriented SiC composite substrate in the thickness direction, the first biaxially oriented SiC layer 20 and the second biaxially oriented SiC layer 30 are preferably layers having low resistivities, typically, resistivities of 20 mΩcm or less. An n-type SiC layer is preferable as the low-resistivity biaxially oriented SiC layer. A biaxially oriented SiC composite substrate that includes biaxially oriented SiC layers having such electrical conductivities has electrical conductivity in the thickness direction and can be used as a substrate of a vertical device (for example, a power device). Depending on the usage, the biaxially oriented SiC composite substrate may be p-type SiC.

From the viewpoint of imparting an insulating property to the biaxially oriented SiC composite substrate 10 in the thickness direction, the first biaxially oriented SiC layer 20 and the second biaxially oriented SiC layer 30 are preferably layers having high resistivities, typically, resistivities of $1 \times 10^7$ Ωcm or more. For example, a biaxially oriented SiC layer having high resistivity is a layer that does not contain a dopant. Alternatively, such a high resistivity can be obtained when both an n-type dopant and a p-type dopant are contained. A biaxially oriented SiC composite substrate that includes biaxially oriented SiC layers having such insulating properties has an insulating property and can be used as a base substrate of a horizontal device (for example, a high-frequency power device in which a GaN layer, an AlGaN layer, etc., are formed on a biaxially oriented SiC composite substrate).

Next, a method for producing the biaxially oriented SiC composite substrate 10 is described. The biaxially oriented SIC composite substrate 10 of this embodiment can be produced by various production methods; however, here, the case in which a SiC single crystal layer is used as the first biaxially oriented SiC layer 20 and a second biaxially oriented SiC layer 30 is formed on the surface of the SiC single crystal layer is described.

The method for forming the second biaxially oriented SiC layer is not particularly limited as long as a second biaxially oriented SiC layer that contains a rare earth element and has a smaller defect density than the first biaxially oriented SiC layer is obtained. A gas phase method such as CVD or a sublimation method, a liquid phase method such as a solution method, or a solid phase method may be employed.

Described below is a process of forming an orientation precursor layer and obtaining a biaxially oriented SiC layer by performing a heat treatment step thereon. Specifically, (a) an orientation precursor layer 40 forming step, (b) a heat treatment step, and (c) a grinding step are included. The orientation precursor layer 40 turns into the second biaxially oriented SiC layer 30 once subjected to a heat treatment described below. Hereinafter, these steps are described in sequence by referring to FIGS. 2A-2C. By producing a SiC composite substrate through such steps (a) to (c), the effect of decreasing the defect density in the second biaxially oriented SiC layer relative to the first biaxially oriented SiC layer (SiC single crystal layer) can be further enhanced.

Figure 2:
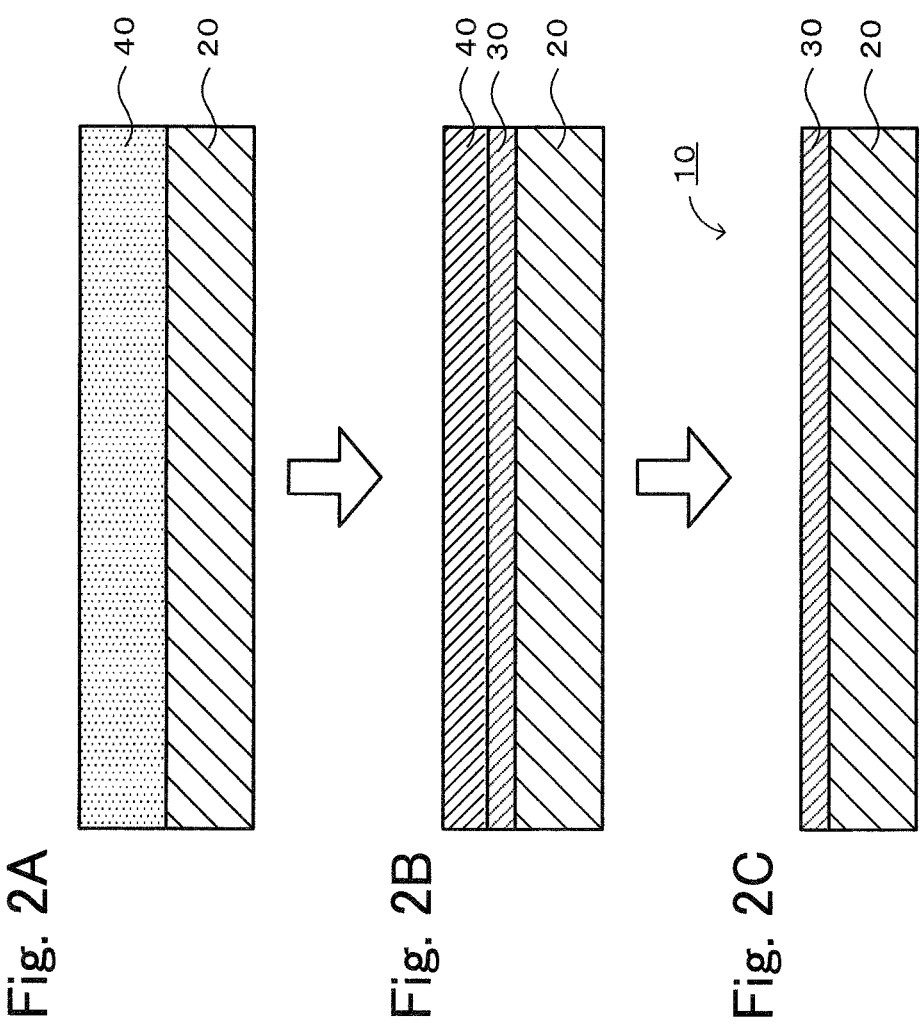
FIGS. 2A-2C are diagrams illustrating steps for producing the biaxially oriented SiC composite substrate 10.

(a) Orientation Precursor Layer 40 Forming Step (Refer to FIG. 2A)

In the orientation precursor layer 40 forming step, a SiC single crystal layer is used as the first biaxially oriented SiC layer 20, and an orientation precursor layer 40 is formed on a crystal growth surface of the SiC single crystal layer. The SiC single crystal layer is preferably a 4H or 6H polytype layer. The crystal growth surface of the SiC single crystal layer is preferably a Si-face having an off-angle of 0.1 to 12° with respect to the SiC [0001] axis. The off-angle is more preferably 1 to 5°. The first biaxially oriented SiC layer 20 is not particularly limited to a SiC single crystal layer, and any SiC layer oriented along two axes, the a-axis and the c-axis, can be used.

A known method can be employed as the orientation precursor layer 40 forming method. Examples of the orientation precursor layer 40 forming method include solid-phase deposition methods such as an AD (aerosol deposition) method and a HPPD (hypersonic plasma particle deposition) method, gas-phase deposition methods such as a sputtering method, a vapor deposition method, a sublimation method, and various CVD (chemical vapor deposition) methods, and liquid-phase deposition methods such as a solution growth method, and a method with which the orientation precursor layer 40 is directly formed on the first biaxially oriented SiC layer 20 can be employed. As the CVD method, for example, a thermal CVD method, a plasma CVD method, a mist CVD method, a MO (metal organic) CVD method, or the like can be employed. A method that involves using, as the orientation precursor layer 40, a polycrystal body prepared in advance by a sublimation method, various CVD methods, sintering, or the like and placing the polycrystal body on the first biaxially oriented SiC layer 20 can also be employed. Alternatively, a method that involves preparing a formed body of the orientation precursor layer 40 in advance, and placing this formed body on the first biaxially oriented SiC layer 20 may also be employed. Such an orientation precursor layer 40 may be a tape formed body prepared by tape forming, or a powder compact prepared by pressure forming, such as uniaxial pressing.

In forming these orientation precursor layers 40, the raw material powder of the orientation precursor layer 40 is designed to contain a rare earth compound corresponding to the concentration of the rare earth element in the second biaxially oriented SiC layer 30. The rare earth compound is not particularly limited, and examples thereof include oxides, nitrides, carbides, and fluorides of at least one element selected from the aforementioned seventeen rare earth elements. When Al is to be contained in the second biaxially oriented SiC layer 30, an Al compound is added to the raw material powder of the orientation precursor layer 40 according to the Al concentration in the second biaxially oriented SiC layer 30. The Al compound is not particularly limited, and examples thereof include aluminum oxide, aluminum nitride, aluminum carbide, and aluminum fluoride. When N is contained in the second biaxially oriented SiC layer 30, a nitrogen compound is added to the raw material powder of the orientation precursor layer 40 according to the N concentration in the second biaxially oriented SiC layer 30. The nitrogen compound is not particularly limited, and an example thereof is aluminum nitride. When N is to be contained in the second biaxially oriented SiC layer 30, N can be added by the following method. That is, N can be added by synthesizing a second biaxially oriented SiC layer from a raw material powder of the orientation precursor layer 40 in a nitrogen atmosphere, or by annealing the synthesized second biaxially oriented SiC layer in a nitrogen atmosphere.

When various CVD methods, a sublimation method, a solution growth method, or the like is employed in the technique of directly forming the orientation precursor layer 40 on the first biaxially oriented SiC layer 20, there are cases in which epitaxial growth occurs on the first biaxially oriented SiC layer 20 without the heat treatment step described below and the second biaxially oriented SiC layer 30 is formed as a result. However, the orientation precursor layer 40 is preferably in a non-oriented state when formed, that is, is amorphous or non-oriented polycrystal, and is preferably oriented in the subsequent heat treatment step by using SiC single crystals as seeds. In this manner, crystal defects reaching the surface of the second biaxially oriented SiC layer 30 can be effectively reduced. The reason for this is not clear, but is presumably that it may be effective for eliminating crystal defects to have the crystal structure of the solid-phase orientation precursor layer re-aligned on SiC single crystals as seeds. Thus, when various CVD methods, a sublimation method, a solution growth method, and the like are employed, it is preferable to select conditions in the orientation precursor layer 40 forming step such that epitaxial growth does not occur.

However, preferable is the method that involves directly forming the orientation precursor layer 40 on the first biaxially oriented SiC layer 20 by an AD method or various CVD methods, or the method that involves placing a polycrystal body, which has been separately prepared by a sublimation method, various CVD methods, or sintering, on the first biaxially oriented SiC layer 20. When these methods are used, the orientation precursor layer 40 can be formed in a relatively short time. The AD method does not require a high-vacuum process and offers a relatively high film forming speed, and thus is particularly preferable. In the method that uses a preliminarily prepared polycrystal body as the orientation precursor layer 40, efforts must be taken to increase the adhesion between the polycrystal body and the first biaxially oriented SiC layer 20, such as preparing the surface of the polycrystal body to be sufficiently flat and smooth. Thus, from the cost viewpoint, the method that involves directly forming the orientation precursor layer 40 is preferable. A method that involves placing a preliminarily prepared formed body on the first biaxially oriented SiC layer 20 is also preferable as a simple and easy method; however, since the orientation precursor layer 40 is composed of powder, a process of sintering the powder in the heat treatment step described below is needed. In any method, known conditions can be employed; however, in the description below, the method that involves directly forming the orientation precursor layer 40 on the first biaxially oriented SiC layer 20 by an AD method or a thermal CVD method, and the method that involves placing a formed body, which has been prepared in advance, on the first biaxially oriented SiC layer 20 are described.

Figure 3:
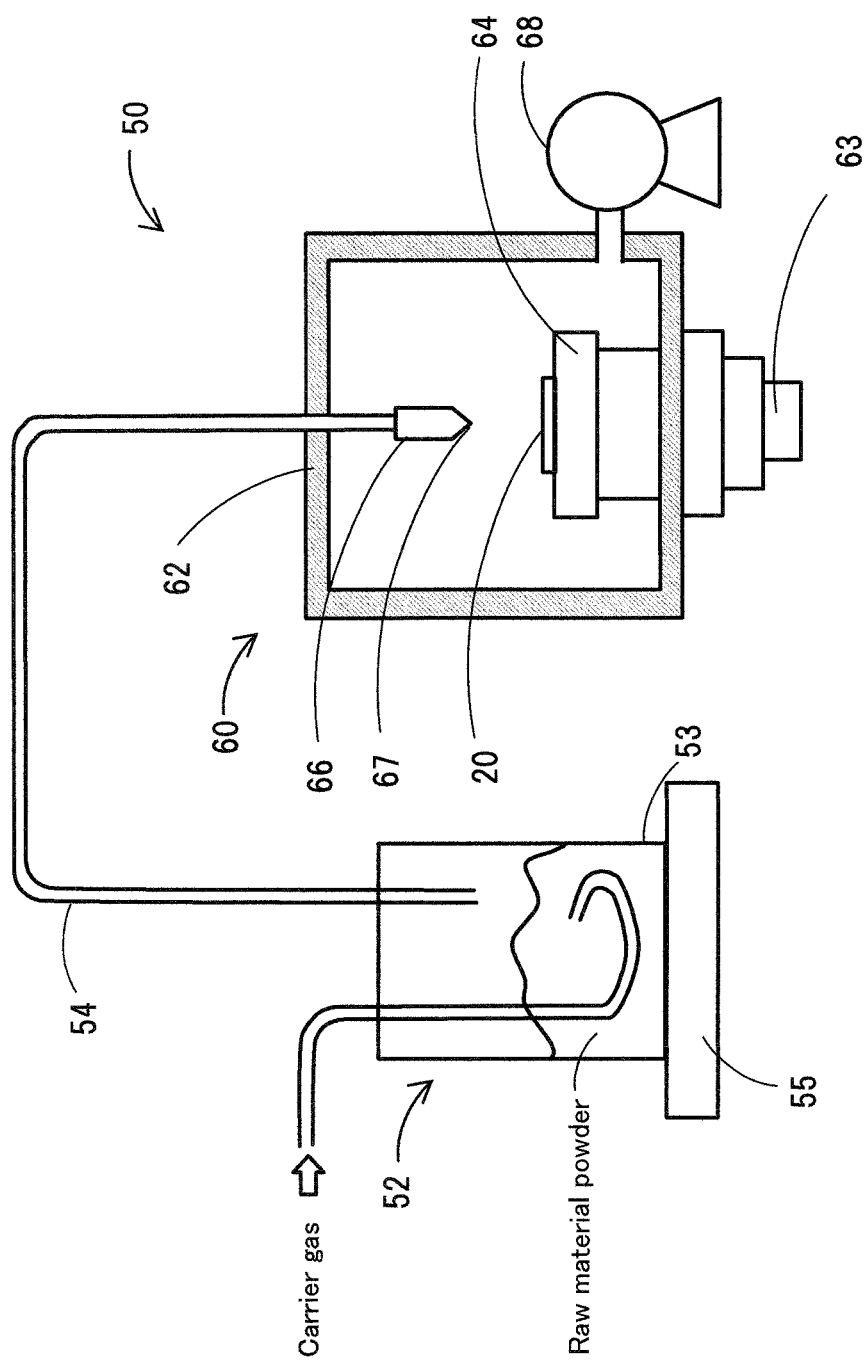
FIG. 3 is a schematic diagram of an AD apparatus 50.

The AD method is a film-forming technique that involves mixing fine particles or a fine particle raw material with gas to form aerosol and ejecting the aerosol from a nozzle at high speed to cause the aerosol to collide with a substrate, and features that a film can be formed at normal temperature. An example of the film forming apparatus (AD apparatus)

used in this AD method is illustrated in FIG. 3. An AD apparatus 50 illustrated in FIG. 3 is designed as an apparatus that can be used in an AD method that involves ejecting a raw material powder onto a substrate in an atmosphere having an atmosphere pressure lower than the barometric pressure. This AD apparatus 50 includes an aerosol generating unit 52 that generates aerosol of a raw material powder that contains a raw material component, and a film forming unit 60 that ejects the raw material powder toward the first biaxially oriented SiC layer 20 to form a film that contains the raw material component. The aerosol generating unit 52 includes an aerosol generating chamber 53 that stores the raw material powder and generates aerosol by receiving the supply of a carrier gas from a gas tank not illustrated in the drawing, a raw material supply pipe 54 that supplies the generated aerosol to the film forming unit 60, and a shaker 55 that applies vibrations to the aerosol generating chamber 53 and the aerosol therein at a vibration rate of 10 to 100 Hz. The film forming unit 60 includes a film forming chamber 62 in which the aerosol is ejected toward the first biaxially oriented SiC layer 20, a substrate holder 64 that is installed in the film forming chamber 62 and sets the first biaxially oriented SiC layer 20 in place, and an X-Y stage 63 that moves the substrate holder 64 in the X axis-Y axis directions. The film forming unit 60 includes an ejection nozzle 66 that has a slit 67 at the tip and ejects the aerosol toward the first biaxially oriented SiC layer 20, and a vacuum pump 68 that decreases the pressure of the film forming chamber 62. The ejection nozzle 66 is installed at the tip of the raw material supply pipe 54.

The AD method is known to generate pores in the film or form a film formed of a powder compact depending on the film forming conditions. For example, the speed at which the raw material powder collides with the substrate, the particle diameter of the raw material powder, the aggregation state of the raw material powder in the aerosol, the ejection amount per unit time, etc., are likely to be influential. The speed at which the raw material powder collides with the substrate is affected by the difference in pressure between the film forming chamber 62 and the inside of the ejection nozzle 66, the area of the opening of the ejection nozzle, etc. Thus in order to obtain a dense orientation precursor layer, these factors need to be appropriately controlled.

In the thermal CVD method, a well-known deposition device such as a commercial deposition device can be used. No particular limitation is imposed on the raw material gases. Silicon tetrachloride ($SiCl_4$) gas or silane ($SiH_4$) gas can be used as the supply source of Si, and methane ($CH_4$) gas, propane ($C_3H_8$) gas, etc. can be used as the supply source of C. The deposition temperature is preferably 1000 to 2200° C., more preferably 1100 to 2000° C., and still more preferably 1200 to 1900° C.

It is known that, when a thermal CVD method is used to deposit a film on the first biaxially oriented SiC layer 20, there are cases in which epitaxial growth occurs on the first biaxially oriented SiC layer 20 and the second biaxially oriented SiC layer 30 is formed as a result. However, the orientation precursor layer 40 is preferably in a non-oriented state when formed, that is, is amorphous or non-oriented polycrystal, and crystal realignment is preferably induced during the heat treatment step by using the SiC single crystals as the seed crystals. It is known that when an amorphous or polycrystal layer is to be formed on a SiC single crystal by a thermal CVD method, the film forming temperature, the gas flow rates of the Si source and the C source and the ratios thereof, the film forming pressure, etc., are influential. The influence of the film forming temperature is strong, and, from the viewpoint of forming an amorphous or polycrystal layer, the film forming temperature is preferably low, preferably lower than 1700° C., more preferably 1500° C. or lower, and particularly preferably 1400° C. or lower. However, at an excessively low film forming temperature, the film forming rate itself is decreased, and thus from the viewpoint of the film forming rate, the film forming temperatures is preferably high.

When a preliminarily prepared formed body is to be used as the orientation precursor layer 40, the formed body can be prepared by forming a raw material powder of the orientation precursor. For example, when press forming is employed, the orientation precursor layer 40 is a press-formed body. A press-formed body can be prepared by press-forming a raw material powder of the orientation precursor by a known method, and may be prepared, for example, by placing a raw material powder in a mold and pressing the raw material powder at a pressure of preferably 100 to 400 $kgf/cm^2$ and more preferably 150 to 300 $kgf/cm^2$. In addition, the forming method is not particularly limited, and, instead of press forming, tape forming, extrusion forming, cast forming, a doctor blade method, and any desired combination of these can be employed. For example, when tape forming is employed, it is preferable to appropriately add additives such as a binder, a plasticizer, a dispersing agent, and a dispersion medium to the raw material powder to form a slurry, and allow the slurry to pass through a narrow slit-shaped discharge port to eject and form the slurry into a sheet shape. The thickness of the sheet-shaped formed body is not particularly limited, but, from the viewpoint of handling, the thickness is preferably 5 to 500 µm. Furthermore, when a thick orientation precursor layer is necessary, multiple sheet formed bodies may be stacked to a desired thickness and used. When these formed bodies are subsequently heat-treated on the first biaxially oriented SiC layer 20, a portion near the first biaxially oriented SiC layer 20 turns into the second biaxially oriented SiC layer 30. According to this method, the formed body needs to be sintered in the heat treatment step described below. It is preferable to form the second biaxially oriented SiC layer 30 after performing a step of sintering the formed body to integrate the formed body and the first biaxially oriented SiC layer 20 into a polycrystal body. If the formed body does not undergo a sintered state, epitaxial growth from SiC single crystals as the seeds may not sufficiently occur. Thus, the formed body may contain, in addition to the SiC raw material, additives such as a sintering aid.

(b) Heat Treatment Step (Refer to FIG. 2B)

In the heat treatment step, a multilayer body in which the orientation precursor layer 40 is stacked or placed on the first biaxially oriented SiC layer 20 is heat-treated to generate the second biaxially oriented SiC layer 30. The heat treatment method is not particularly limited as long as epitaxial growth occurs from the first biaxially oriented SiC layer 20 as the seed, and can be performed in a know heat treatment furnace such as a pipe furnace or a hot plate. Moreover, not only these normal-pressure (press-less) heat treatment, but also a pressure heat treatment such as hot press and HIP, and a combination of a normal-pressure heat treatment and a pressure heat treatment can be employed. The atmosphere of the heat treatment can be selected from vacuum, nitrogen, and an inert gas atmosphere. The heat treatment temperature is preferably 1700 to 2700° C. By increasing the temperature, the orientation precursor layer 40 can smoothly grow from the first biaxially oriented SiC layer 20 serving as the seed crystal while becoming oriented along the c-axis and the a-axis. Thus, the temperature is preferably 1700° C. or higher, more preferably 1850° C. or higher, yet more preferably 2000° C. or higher, and particularly preferably 2200° C. or higher. Meanwhile, at an excessively high temperature, part of SiC may be lost by sublimation, or SiC may undergo plastic deformation, resulting in issues such as warping. Thus, the temperature is preferably 2700° C. or lower and more preferably 2500° C. or lower. The heat treatment temperature and the retention time are related to the thickness of the second biaxially oriented SiC layer 30 generated by epitaxial growth, and can be adjusted as appropriate.

However, when a preliminarily prepared formed body is used as the orientation precursor layer 40, the formed body must be sintered during the heat treatment, and thus high-temperature, normal-pressure firing, hot press, HIP, or any combination of these is preferable. For example, when hot press is employed, the surface pressure is preferably 50 kgf/cm$^2$ or more, more preferably 100 kgf/cm$^2$ or more, and yet preferably 200 kgf/cm$^2$ or more, and there is no particular upper limit. In addition, as long as sintering and epitaxial growth are achieved, the firing temperature is not particularly limited. The temperature is preferably 1700° C. or higher, more preferably 1800° C. or higher, yet more preferably 2000° C. or higher, and particularly preferably 2200° C. or higher. The atmosphere during firing can be selected from vacuum, nitrogen, an inert gas atmosphere, and a mixed gas of nitrogen and inert gas. The SiC powder that serves as a raw material may be α-SiC or β-SiC. The SiC powder is constituted by SiC particles preferably having an average particle diameter of 0.01 to 5 μm. The average particle diameter refers to the value obtained by observing the powder with a scanning electron microscope, measuring the direction-fixed maximum diameters of one hundred primary particles, and averaging the results.

In the heat treatment step, since crystals in the orientation precursor layer 40 grow from the crystal growth surface of the first biaxially oriented SiC layer 20 while orienting along the c-axis and the a-axis, the orientation precursor layer 40 gradually turns into the second biaxially oriented SiC layer 30 from the crystal growth surface. The generated second biaxially oriented SiC layer 30 has a low defect density (for example, $1\times10^2$/cm$^2$ or less).

(c) Grinding Step (Refer to FIG. 2C)

In the grinding step, the orientation precursor layer 40 that remains on the second biaxially oriented SiC layer 30 after the annealing step is ground and removed so as to expose the surface of the second biaxially oriented SiC layer 30, and the exposed surface is polished with diamond abrasive grains and then further subjected to CMP (chemical mechanical polishing) finish. As a result, a biaxially oriented SiC composite substrate 10 is obtained.

Next, a method for growing a SiC epitaxial layer on the surface of the second biaxially oriented SiC layer 30 of the biaxially oriented SiC composite substrate 10 is described. The method for growing the SiC epitaxial layer is not particularly limited, and a known method can be employed. For example, the biaxially oriented SiC composite substrate 10 may be placed on a susceptor in a CVD apparatus so that the surface of the second biaxially oriented SiC layer 30 faces upward, and epitaxial growth may be conducted by using silane and propane as source gases and hydrogen as a carrier gas. During this process, the growth temperature is preferably set within the range of 1570° C. or higher and 1610° C. or lower. In addition, the concentration ratio C/Si is preferably set within the range of 0.7 or more and 1.2 or less.

According to this embodiment described in detail heretofore, the rare earth element concentration in the second biaxially oriented SiC layer 30 of the biaxially oriented SiC composite substrate 10 is set to be within the range of $1\times10^{16}$ atoms/cm$^3$ or more and $1\times10^{19}$ atoms/cm$^3$ or less. Thus, the density of defects that reach the surface of the second biaxially oriented SiC layer 30 can be decreased compared to the first biaxially oriented SiC layer 20. Such a biaxially oriented SiC composite substrate 10 has less warpage and a low density of defects that reach the surface of the second biaxially oriented SiC layer 30; thus, this biaxially oriented SiC composite substrate 10 is suitable for producing a semiconductor device by forming a functional layer on the surface by epitaxial growth or the like. Moreover, since the second biaxially oriented SiC layer 30 does not contain Nb, Ta, etc., the substrate can be used even in a situation where Nb, Ta, etc., affect semiconductor properties.

The rare earth element contained in the second biaxially oriented SiC layer 30 is preferably at least one selected from the group consisting of Y, Sm, Ho, Dy, and Yb. In this manner, the density of defects that reach the surface of the second biaxially oriented SiC layer 30 can be further decreased.

The density of the defects that reach the surface of the second biaxially oriented SiC layer 30 is preferably $1.0\times10^2$/cm$^2$ or less, more preferably $1.0\times10^1$/cm$^2$ or less, and yet more preferably $1.0\times10^0$/cm$^2$ or less.

Furthermore, the second biaxially oriented SiC layer 30 preferably contains Al, and the Al concentration in the second biaxially oriented SiC layer 30 is preferably $1\times10^{16}$ atoms/cm$^3$ or more and $1\times10^{21}$ atoms/cm$^3$ or less. In this manner, the density of defects that reach the surface of the second biaxially oriented SiC layer 30 can be further decreased. The (Al concentration)/(rare earth element concentration) in the second biaxially oriented SiC layer 30 is preferably $1\times10^{-2}$ or more and $1\times10^5$ or less.

Furthermore, the second biaxially oriented SiC layer 30 preferably contains N in addition to Al, and the N concentration in the second biaxially oriented SiC layer 30 is preferably $1\times10^{17}$ atoms/cm$^3$ or more and $1\times10^{22}$ atoms/cm$^3$ or less. In this manner, the density of defects that reach the surface of the second biaxially oriented SiC layer 30 can be further decreased. The (N concentration)/(rare earth element concentration) in the second biaxially oriented SiC layer 30 is preferably $1\times10^{-2}$ or more and $1\times10^5$ or less.

Furthermore, the (N concentration)/(Al concentration) in the second biaxially oriented SiC layer 30 is preferably 3 or more and 5 or less, the concentrations of the rare earth element, Al, and N in the second biaxially oriented SiC layer 30 are preferably in the relationship, N>Al> rare earth element, and the concentrations of the rare earth element, Al, and N in the second biaxially oriented SiC layer 30 are preferably higher than those in the first biaxially oriented SiC layer.

Furthermore, from the viewpoint of decreasing the density of defects reaching the surface of the second biaxially oriented SiC layer 30, Ar is preferably contained near the interface between the first biaxially oriented SiC layer 20 and the second biaxially oriented SiC layer 30, and the defect density of the first biaxially oriented SiC layer 20 is preferably low.

Furthermore, the biaxially oriented SiC composite substrate 10 can be designed as a semiconductor device composite substrate by forming a semiconductor device functional layer on the second biaxially oriented SiC layer 30 of the biaxially oriented SiC composite substrate 10. An example of the semiconductor device functional layer is a SiC epitaxial layer. The SiC epitaxial layer is formed on the surface (surface opposite from the surface in contact with the first biaxially oriented SiC layer 20) of the second biaxially oriented SiC layer 30 by supplying a source gas for making SiC. Examples of the semiconductor device composite substrate include a MOSFET, an IGBT, an LED, and a HEMT.

It is understood that the present invention is not limited to the embodiment described above in any way and may be carried out in various modes so long as they fall within the technical scope of the present invention.

For example, in the embodiment described above, only one second biaxially oriented SiC layer 30 is formed on the first biaxially oriented SiC layer 20; alternatively, two or more second biaxially oriented SiC layers 30 may be formed. Specifically, a second second biaxially oriented SiC layer 30 can be formed on the first second biaxially oriented SiC layer 30 by performing, in sequence, deposition of an orientation precursor layer 40 on the second biaxially oriented SiC layer 30 of the biaxially oriented SiC composite substrate 10, a heat treatment, annealing, and grinding.

EXAMPLES

Examples of the present invention will next be described. Experimental Examples 1 to 4 below correspond to Examples of the present invention. The following Examples do not limit the invention in any manner.

Experimental Example 1

1. Preparation of SiC Composite Substrate
(1) Preparation of Orientation Precursor Layer A raw material powder containing 91.6 wt % of a commercially available fine β-SiC powder (volume-basis D50: 0.7 μm), 7.1 wt % of an yttrium oxide powder (volume-basis D50: 0.1 μm), and 1.3 wt % of an aluminum nitride powder (volume-basis D50: 0.5 μm) was mixed in ethanol with SiC balls in a ball mill for 24 hours, and dried to obtain a mixed powder. As the first biaxially oriented SiC layer, a commercially available SiC single crystal substrate (n-type 4H—SiC, diameter: 50.8 mm (2 inches), Si-face, (0001) plane, off-angle: 4°, thickness: 0.35 mm, no orientation flat) was prepared, and the mixed powder was ejected onto the SiC single crystal substrate by using the AD apparatus 50 illustrated in FIG. 1 so as to form an AD film (orientation precursor layer).

The AD film forming conditions were as follows. First, $N_2$ was used as the carrier gas, and a film was formed by using a ceramic nozzle having a 5 mm (long side)×0.4 mm (short side) slit. As for the nozzle scanning conditions, the nozzle was moved, at a scanning speed of 0.5 mm/s, 55 mm in a nozzle advancing direction perpendicular to the long side of the slit, 5 mm in a slit long side direction, 55 mm in a nozzle retracting direction perpendicular to the long side of the slit, and 5 mm in a slit long side direction away from the initial position, and these movements were repeated; then as soon as the nozzle had moved 55 mm from the initial position in the slit long side direction, this scanning was performed in a reverse direction so as to return to the initial position. This series of scanning was assumed constitute one cycle, and scanning was repeated up to 1200 cycles. The thickness of the AD film formed as a result was about 120 μm.

(2) Heat Treatment of Orientation Precursor Layer

The SiC single crystal substrate on which the AD film serving as the orientation precursor layer was formed was discharged from the AD apparatus, annealed in a $N_2$ atmosphere at 1950° C. for 6 hours, and then annealed in an argon atmosphere at 2450° C. for 5 hours. In other words, the orientation precursor layer was heat-treated into a heat-treated layer.

(3) Grinding and Polishing
(3-1) Polishing 1

The entire surface of the obtained heat-treated layer was polished with diamond abrasive grains so that the entire surface was parallel to the rear surface (the bottom surface of the SiC single crystal substrate), and then finished by chemical mechanical polishing (CMP) to obtain a composite substrate.

(3-2) Polishing 2

A sample was separately prepared as in (1) and (2), and cut in a direction orthogonal to the plate surface and passing the center portion of the substrate. The cut sample was lapped with diamond abrasive grains to smoothen the cross section, and mirror-finished by chemical mechanical polishing (CMP).

2. Evaluation of Heat-Treated Layer
(1) Biaxial Orientation Property

An EBSD (electron backscatter diffraction patterns) method was employed to obtain inverse pole figure maps of a surface (plate surface) and a cross section orthogonal to the plate surface for each of the heat-treated layers prepared in (3-1) and (3-2), and the tilt angle distribution was found to be 0.01° or less both in the near normal direction and the near plate-surface direction. Thus, it was determined that the heat-treated layer was a second biaxially oriented SiC layer that was formed on the SiC single crystal substrate serving as the first biaxially oriented SiC layer and that was oriented along the c-axis and the a-axis.

[EBSD Measurement Conditions]
  Accelerating voltage: 15 kv
  Spot intensity: 70
  Working distance: 22.5 mm
  Step size: 0.5 μm
  Sample tilt angle: 70°
  Measurement program: Aztec (version 3.3)

(2) Y, Al, and N Contents in Biaxially Oriented SiC Layer

1. Dynamic secondary ion mass spectrometry (D-SIMS) was performed on the polished surface of a composite substrate prepared as in (1) to (3) and (3-1). IMF-6f produced by CAMECA was used as the analyzer for Y and Al, and the measurement was performed with a primary ion species, $O_{2+}$ at an accelerating voltage of 8 kv. IMF-7f produced by CAMECA was used as the analyzer for N, measurement was performed with a primary ion species $Cs^+$ at an accelerating voltage of 14.5 kv, and the Y, Al and N contents (maximum values) in the second biaxially oriented SiC layer were determined. In addition, the Al/Y concentration ratio, the N/Y concentration ratio, and the N/Al concentration ratio were also determined. The obtained results are indicated in Table 1.

(3) Defect Density of Second Biaxially Oriented SiC Layer

1. The defect density of the surface was evaluated by the following method for the polished surface of a composite substrate prepared as in (1) to (3) and (3-1). The composite substrate and KOH crystals were placed together in a nickel crucible and etched at 500° C. for 10 minutes in an electric furnace. The evaluation sample after etching was washed and observed with an optical microscope, and the number of pits indicating BPDs and TSDs was counted by a known method. Specifically, for an arbitrarily selected site in the evaluation sample surface, a 2.3 mm (length)×3.6 mm (width) view area was imaged at a magnification of 50× to take one hundred images, the total number of pits was counted, and the counted total number of pits was divided by the total area, 8.05 cm², to determine the defect density. Furthermore, the defect density of the SiC single crystal substrate used as the first biaxially oriented layer was calculated in the same manner. The results are as indicated in Table 1.

Experimental Example 2

Experiment was carried out as in Experimental Example 1 except that a raw material powder containing 89.1 wt % of a β-SiC powder, 7.1 wt % of an yttrium oxide powder, and 3.8 wt % of an aluminum oxide powder was used and that annealing at 1950° C. in a $N_2$ atmosphere was not performed. The obtained heat-treated layer was confirmed to be the second biaxially oriented SiC layer. The Y and Al concentrations and the Al/Y concentration ratio in the second biaxially oriented SiC layer, and the defect density of the surface of the second biaxially oriented SiC layer were as indicated in Table 1.

Experimental Example 3

Experiment was carried out as in Experimental Example 1 except that a raw material powder containing 92.9 wt % of a β-SiC powder and 7.1 wt % of an yttrium oxide powder was used. The obtained heat-treated layer was confirmed to be the second biaxially oriented SiC layer. The Y and N concentrations and the N/Y concentration ratio in the second biaxially oriented SiC layer, and the defect density of the surface of the second biaxially oriented SiC layer were as indicated in Table 1.

Experimental Example 4

Experiment was carried out as in Experimental Example 1 except that a raw material powder containing 88.16 wt % of a β-SiC powder, 10.6 wt % of a samarium oxide powder (volume-basis D50: 0.1 μm), and 1.3 wt % of an aluminum nitride powder was used. The obtained heat-treated layer was confirmed to be the second biaxially oriented SiC layer. The Sm, Al, and N concentrations, the Al/Sm concentration ratio, the N/Sm concentration ratio, and the N/Al concentration ratio in the second biaxially oriented SiC layer, and the defect density of the surface of the second biaxially oriented SiC layer were as indicated in Table 1.

preferably within the range of $1\times10^{16}$ to $1\times10^{19}$ atoms/cm³. In addition to the rare earth element within this concentration range, inclusion of an appropriate amount of aluminum further enhances the defect density-decreasing effect, and, furthermore, inclusion of an appropriate amount of nitrogen is even more effective.

The present application claims priority from JP Patent Application No. 2020-009649 filed Jan. 24, 2020, the entire contents of which are incorporated herein by reference.

What is claimed is:

1. A biaxially oriented SiC composite substrate comprising:
    a first biaxially oriented SiC layer that contains a threading screw dislocation and a basal plane dislocation; and
    a second biaxially oriented SiC layer that is formed continuously from the first biaxially oriented SiC layer and that contains $1\times10^{16}$ atoms/cm³ or more and $1\times10^{19}$ atoms/cm³ or less of a rare earth element,
    wherein:
    a defect density of a surface of the second biaxially oriented SiC layer is smaller than a defect density of the first biaxially oriented SiC layer.

2. The biaxially oriented SiC composite substrate according to claim 1, wherein:
    the rare earth element contained in the second biaxially oriented SiC layer is at least one selected from the group comprising of Y, Sm, Ho, Dy, or Yb.

3. The biaxially oriented SiC composite substrate according to claim 1, wherein:
    a density of defects that reach the surface of the second biaxially oriented SiC layer is $1.0\times10^1$/cm² or less.

4. The biaxially oriented SiC composite substrate according to claim 1, wherein:
    the second biaxially oriented SiC layer contains Al, and a concentration of Al in the second biaxially oriented SiC layer is $1\times10^{16}$ atoms/cm³ or more and $1\times10^{21}$ atoms/cm³ or less.

5. The biaxially oriented SiC composite substrate according to claim 4, wherein:
    (Al concentration)/(rare earth element concentration) in the second biaxially oriented SiC layer is $1\times10^{-2}$ or more and $1\times10^5$ or less.

6. The biaxially oriented SiC composite substrate according to claim 4, wherein:

TABLE 1

| Experimental Examples | Concentration in the second biaxially oriented SiC layer (atoms/cm³) | | | | Concentration ratio of rare earth elements and Al and N | | | | | Defect density (/cm²) | |
|---|---|---|---|---|---|---|---|---|---|---|---|
| | | | | | | | | | | First biaxially oriented SiC layer | Surface of the second biaxially oriented SiC layer |
| | Y | Sm | Al | N | Al/Y | N/Y | Al/Sm | N/Sm | N/Al | | |
| 1 | $3.0 \times 10^{18}$ | ND[X1] | $4.5 \times 10^{20}$ | $1.5 \times 10^{21}$ | $1.5 \times 10^2$ | $5.0 \times 10^2$ | — | — | 3.3 | $1.0 \times 10^5$ | $8.5 \times 10^{-1}$ |
| 2 | $2.8 \times 10^{18}$ | ND | $3.9 \times 10^{20}$ | ND | $1.4 \times 10^2$ | — | — | — | — | | $8.4 \times 10^0$ |
| 3 | $3.2 \times 10^{18}$ | ND | ND | $1.4 \times 10^{20}$ | — | $4.4 \times 10^1$ | — | — | — | | $6.9 \times 10^0$ |
| 4 | ND | $3.0 \times 10^{18}$ | $4.4 \times 10^{20}$ | $1.5 \times 10^{21}$ | — | — | $1.5 \times 10^2$ | $5.0 \times 10^2$ | 3.4 | | $8.3 \times 10^{-1}$ |

[X1]ND is an abbreviation below the detection limit.

REMARKS

Experimental Examples 1 to 4 indicate that, in order to effectively decrease the TSD and BPD defect densities in the surface of the second biaxially oriented SiC layer, the concentration of the rare earth element, such as yttrium or samarium, in the second biaxially oriented SiC layer is the second biaxially oriented SiC layer contains N, and a concentration of N in the second biaxially oriented SiC layer is $1\times10^{17}$ atoms/cm³ or more and $1\times10^{22}$ atoms/cm³ or less.

7. The biaxially oriented SiC composite substrate according to claim 6, wherein:

(N concentration)/(rare earth element concentration) in the second biaxially oriented SiC layer is $1\times10^{-2}$ or more and $1\times10^5$ or less.

8. The biaxially oriented SiC composite substrate according to claim 6, wherein:

(N concentration)/(Al concentration) in the second biaxially oriented SiC layer is 3 or more and 5 or less.

9. The biaxially oriented SiC composite substrate according to claim 6, wherein:

concentrations of the rare earth element, Al, and N in the second biaxially oriented SiC layer are in a relationship, N>Al> rare earth element.

10. The biaxially oriented SiC composite substrate according to claim 6, wherein:

concentrations of the rare earth element, Al, and N in the second biaxially oriented SiC layer are higher than those in the first biaxially oriented SiC layer.

11. A semiconductor device composite substrate comprising:

the biaxially oriented SiC composite substrate according to claim 1; and a semiconductor device functional layer disposed on the second biaxially oriented SiC layer of the biaxially oriented SiC composite substrate.

* * * * *